United States Patent
Bediou et al.

(10) Patent No.: US 9,557,357 B2
(45) Date of Patent: Jan. 31, 2017

(54) METHOD AND DEVICE FOR DETECTING A PHOTOVOLTAIC ELECTRICITY PRODUCTION APPARATUS IN AN ELECTRICAL DISTRIBUTION NETWORK, AND ASSOCIATED COMPUTER PROGRAM PRODUCT

(71) Applicant: Schneider Electric Industries SAS, Rueil Malmaison (FR)

(72) Inventors: Stephane Bediou, Saint Nazaire les Eymes (FR); Sylvain Clot, Grenoble (FR); Michel Clemence, Chambery (FR); Philippe Deschamps, Le Pont de Claix (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 14/950,157

(22) Filed: Nov. 24, 2015

(65) Prior Publication Data

US 2016/0161537 A1 Jun. 9, 2016

(30) Foreign Application Priority Data

Dec. 8, 2014 (FR) ..................................... 14 62074

(51) Int. Cl.
*G05D 17/00* (2006.01)
*G01R 21/133* (2006.01)
(Continued)

(52) U.S. Cl.
CPC ....... *G01R 21/133* (2013.01); *H01L 31/02021* (2013.01); *H02S 99/00* (2013.01)

(58) Field of Classification Search
CPC ... G01R 21/133; H01L 31/02021; H02S 99/00
(Continued)

(56) References Cited

U.S. PATENT DOCUMENTS

2012/0143383 A1* 6/2012 Cooperrider ............. H04Q 9/00
700/295
2013/0046415 A1 2/2013 Curtis

FOREIGN PATENT DOCUMENTS

AU 2012233011 A1 4/2013
FR 2 980 946 4/2013

OTHER PUBLICATIONS

French Preliminary Search Report issued Jun. 11, 2015 in French Application 14 62074 filed on Dec. 8, 2014 (with English Translation of Categories of Cited Documents).

* cited by examiner

*Primary Examiner* — Farhana Hoque
(74) *Attorney, Agent, or Firm* — Oblon, McClelland, Maier & Neustadt, L.L.P.

(57) ABSTRACT

A method detects at least one photovoltaic electricity production apparatus in an electrical distribution network including at least one electrical installation and at least one current sensor, each installation further including at least one electrical apparatus. The method includes acquisition, by a current sensor, of a plurality of active power profiles of a corresponding installation, computation, for at least one pair of active power profiles of a differential profile equal to the difference between the power profiles of the pair, computation of a coefficient of correlation between the differential profile or profiles computed and a reference profile, and detection of the presence of a photovoltaic electricity production apparatus among the electrical apparatus or apparatuses of the installation.

15 Claims, 4 Drawing Sheets

Figure 1:
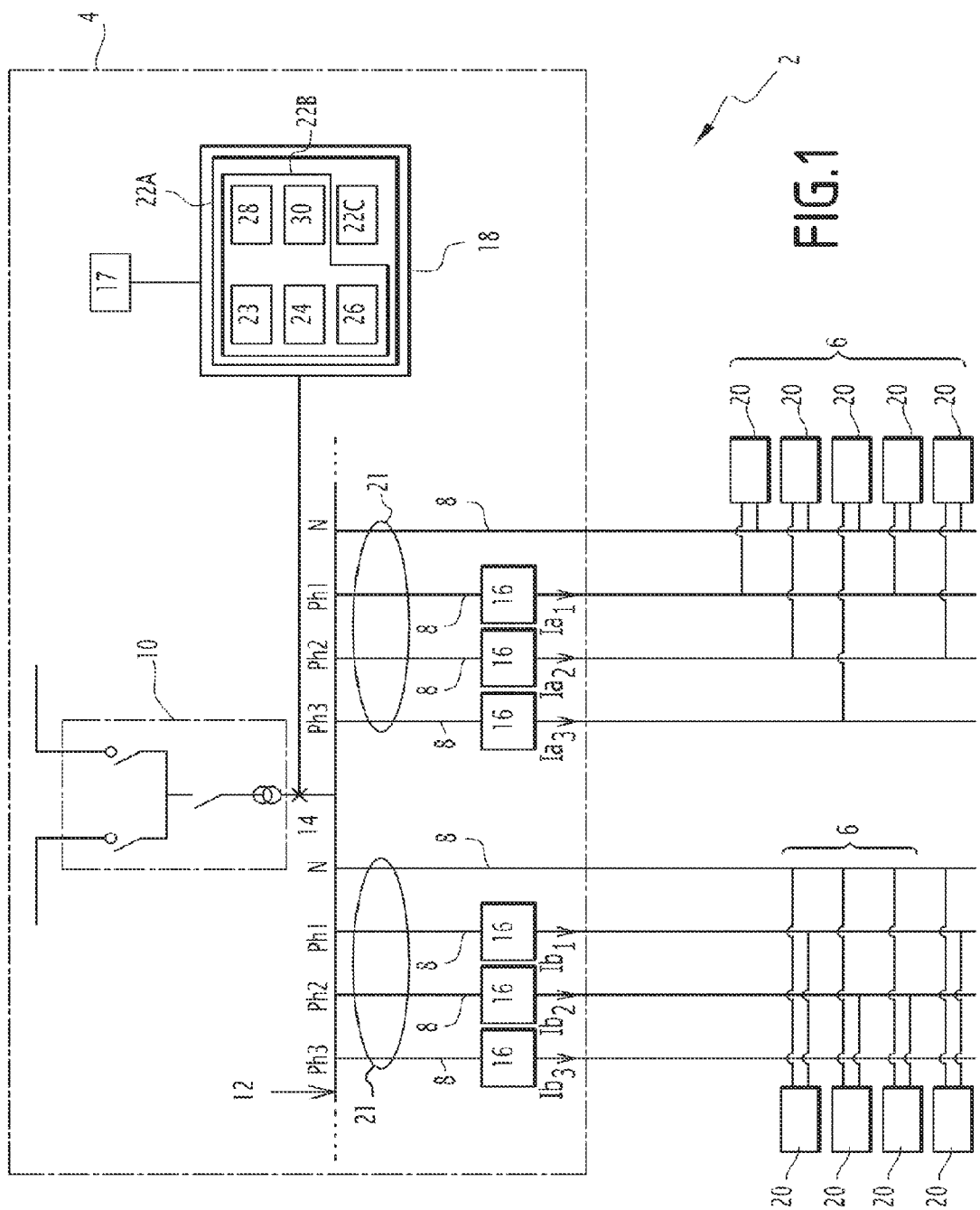

(51) Int. Cl.
*H02S 99/00* (2014.01)
*H01L 31/02* (2006.01)
(58) Field of Classification Search
USPC .................................................. 700/295, 297
See application file for complete search history.

US 9,557,357 B2

METHOD AND DEVICE FOR DETECTING A PHOTOVOLTAIC ELECTRICITY PRODUCTION APPARATUS IN AN ELECTRICAL DISTRIBUTION NETWORK, AND ASSOCIATED COMPUTER PROGRAM PRODUCT

The present invention relates to a method for detecting a photovoltaic electricity production apparatus in an electrical distribution network, a computer program product capable of implementing such a method, and an associated device.

The invention relates to the field of electricity transport and distribution networks. These networks typically comprise a central node to which a number of electrical installations are connected by electrical conductors.

The central node is, for example, a medium voltage/low voltage transformer station ('MV/LV station'), located at the interface between a medium voltage distribution network and the low-voltage distribution network to which the electrical installations are connected.

The electrical installations are, for example, domestic or industrial installations. Each installation generally comprises several electrical apparatuses. These electrical apparatuses comprise electricity consumer apparatuses and/or electricity producer apparatuses.

Such a transport and distribution network naturally experiences significant fluctuations in its electrical load, owing to the variation in local consumption, but also owing to the variation in local electricity production. This is even more significant following the major development in recent years of apparatuses producing electricity from renewable energies, and mainly producing photovoltaic electricity. Indeed, a large number of low-power production apparatuses are now installed in domestic homes or in businesses.

The electrical loads of the network are managed, for example, by the use of controllable loads, as described in patent application FR 2 980 946 A1, or storage equipment. It is therefore necessary to be thoroughly aware of the composition of the electrical network in order to be able to evaluate the expected variations in the network load, and therefore best distribute and dimension these management apparatuses. This is particularly necessary for photovoltaic electricity production installations, whereof the production varies greatly according to the external environment.

However, low-power photovoltaic apparatuses are in general directly connected to the low-voltage (LV) network, and are not necessarily reported to the manager of the electrical network. In addition, even in the case where they are reported to the manager, the latter is not necessarily capable of easily locating the point of attachment, to the network, of the installation comprising said photovoltaic apparatus. Indeed, LV networks are dense, frequently buried, and often undergo modifications sometimes poorly identified.

The object of the invention is therefore to provide a method for detecting one or more photovoltaic electricity production apparatuses among multiple electrical apparatuses of an installation connected to an electrical distribution network.

Accordingly, the subject matter of the invention is a method for detecting at least one photovoltaic electricity production apparatus in an electrical distribution network comprising at least one electrical installation and at least one current sensor, each installation comprising at least one electrical apparatus and being connected to a respective distribution node by at least one respective electrical conductor, each sensor being associated with a respective electrical conductor, said method comprising the following steps:

i/ acquisition, by a current sensor, of a plurality of active power profiles of a corresponding installation, each active power profile comprising a plurality of active power measurements each associated with a respective time instant of a time range;

ii/ computation, for at least one pair of active power profiles, of a differential profile comprising a plurality of values, each value of the differential profile being equal to the difference between two respective measurements of the active power profiles of said pair;

iii/ computation of a coefficient of correlation between the differential profile or profiles computed and a reference profile corresponding to a photovoltaic electricity production;

iv/ detection of the presence of a photovoltaic electricity production apparatus among the electrical apparatus or apparatuses of the installation considered when the coefficient of correlation is greater than a predefined value.

According to other advantageous aspects of the invention, the method of detection comprises one or more of the following features, taken in isolation or according to all the technically possible combinations:

the respective time ranges of the active power profiles of each pair have substantially equal durations:

step ii/ comprises the selection, from among the plurality of acquired profiles, of a pair of profiles for which the consumption of electrical energy by the installation considered is substantially equal, from one profile of the pair to the other, during the measurement time range of each of the two profiles of said pair, and the computation of the differential profile is performed from the selected pair of profiles;

step i/ further comprises the acquisition of a plurality of reactive power profiles, each reactive power profile comprising a plurality of reactive power measurements each associated with a respective time instant of the time range of a corresponding active power profile, and the computation from each reactive power profile of the reactive energy consumed during the corresponding time range, and in which the selection of at least one pair of profiles performed during step ii/ comprises the selection of a pair of profiles for which the total consumption of reactive energy corresponding to one of the profiles of the pair is equal, within 10%, to the total consumption of reactive energy corresponding to the other profile of the pair;

the time range corresponding to each active power profile comprises a daytime period and a night-time period, and the selection of at least one pair of profiles performed during step ii/ comprises the selection of a pair of profiles for which the total consumption of active energy during the night-time period corresponding to one of the profiles of the pair is equal, within 10%, to the total consumption of active energy during the night-time period corresponding to the other one of the profiles of the pair;

step i/ further comprises the acquisition of an insolation value during the measurement of each active power profile, and step ii/ comprises the selection, from among the plurality of acquired active power profiles, of at least one pair of profiles for which the acquired insolation value differs from one profile to the other, and the computation of the differential profile is performed from the selected pair of profiles;

step ii/ comprises the computation of a differential profile for each pair of active power profiles, and the selection of at least one differential profile whereof the maximum absolute value is greater than half the maximum of the set of absolute values of the computed differential profiles, and during step iii/, the computation of the coefficient of correlation is performed according to the differential profile or profiles selected;

step ii/ comprises the computation of at least one differential profile for each pair of active power profiles, and the selection of a differential profile whereof the absolute value has a maximum value for a time instant between two predefined time instants, and during step iii/, the computation of the coefficient of correlation is performed according to the differential profile or profiles selected;

when multiple differential profiles are computed during step ii/, step iii/ further comprises the computation of an average differential profile equal to an average of the computed differential profiles, and the coefficient of correlation is computed between the average differential profile and the reference profile corresponding to the photovoltaic electricity production;

during step i/, each active power profile comprises frequential components, and the frequential components of each active power profile of at least one pair are filtered by a low-pass filter having a cutoff frequency substantially equal to $3.10^{-4}$ Hz, and the computation of the differential profile is performed from the filtered pair of profiles;

the method further comprises a step of estimating the peak power of a photovoltaic electricity production apparatus detected from the computed differential profile;

steps it to iv/ are repeated from active power profiles acquired by another current sensor.

The subject matter of the invention is also a computer program product comprising software instructions that, when they are executed by a computer, implement a method of detection as defined above.

The subject matter of the invention is also a device for detecting at least one photovoltaic electricity production apparatus in an electrical distribution network comprising at least one electrical installation and at least one current sensor, each installation comprising at least one electrical apparatus and being connected to a respective distribution node by at least one respective electrical conductor, each sensor being associated with a respective electrical conductor, said device comprising:

an acquisition module configured for acquiring, by a current sensor, a plurality of active power profiles of a corresponding installation, each active power profile comprising a plurality of active power measurements each associated with a respective time instant of a time range;

a differential module configured for computing, for at least one pair of active power profiles, a differential profile comprising a plurality of values, each value of the differential profile being equal to the difference between two respective measurements of the active power profiles of said pair;

a correlation module configured for computing a coefficient of correlation between the differential profile or profiles computed and a reference profile corresponding to a photovoltaic electricity production; and a detection module configured for detecting the presence of a photovoltaic electricity production apparatus among the electrical apparatus or apparatuses of the installation considered when the coefficient of correlation is greater than a predefined value.

Figure 2:
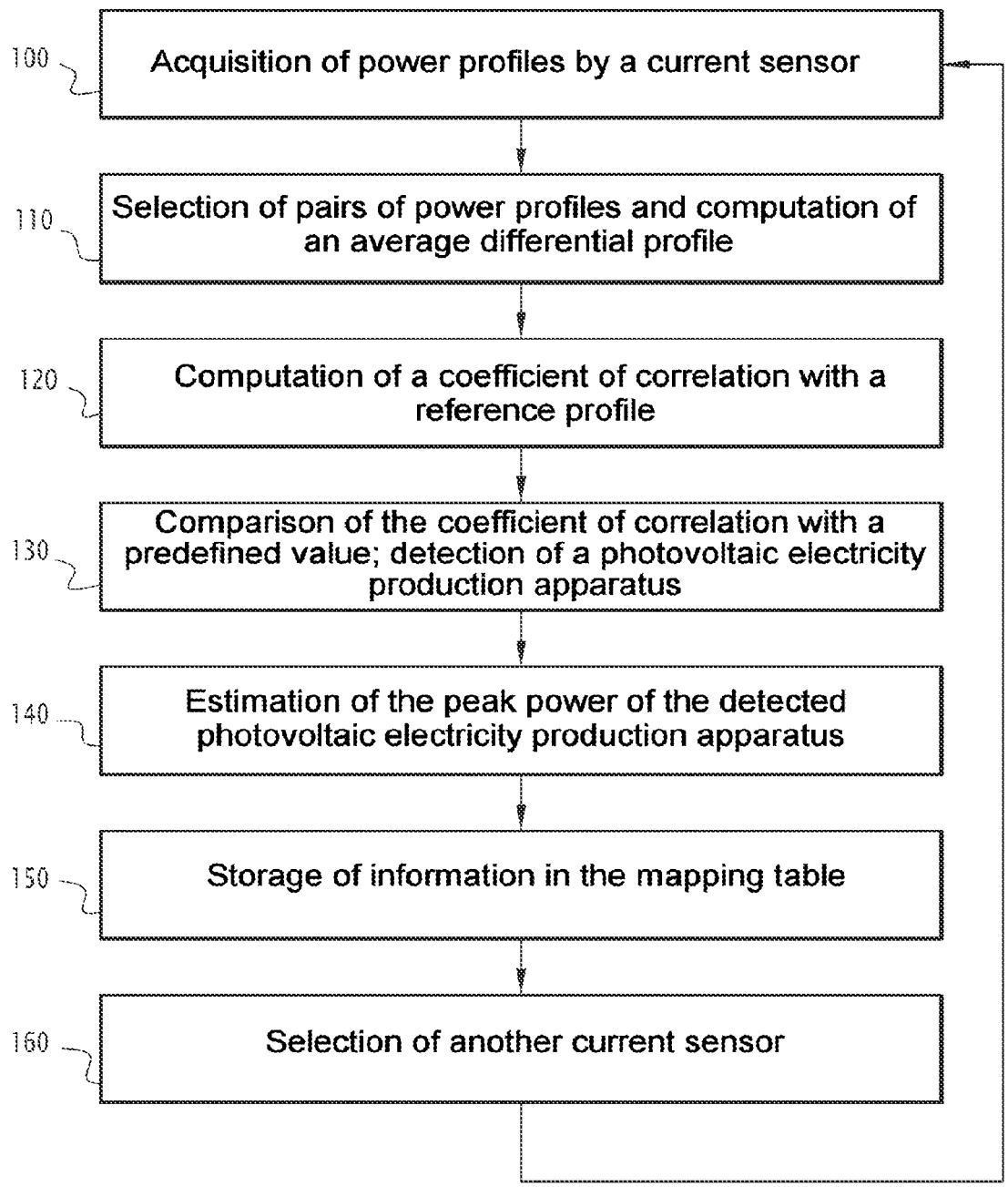
Figure 3:
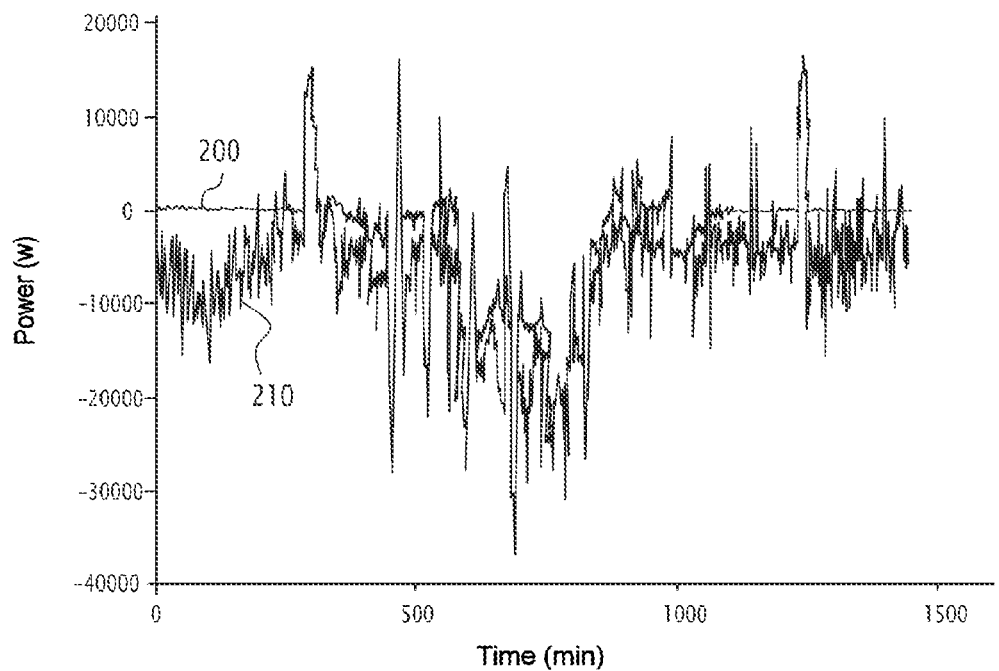
Figure 4:
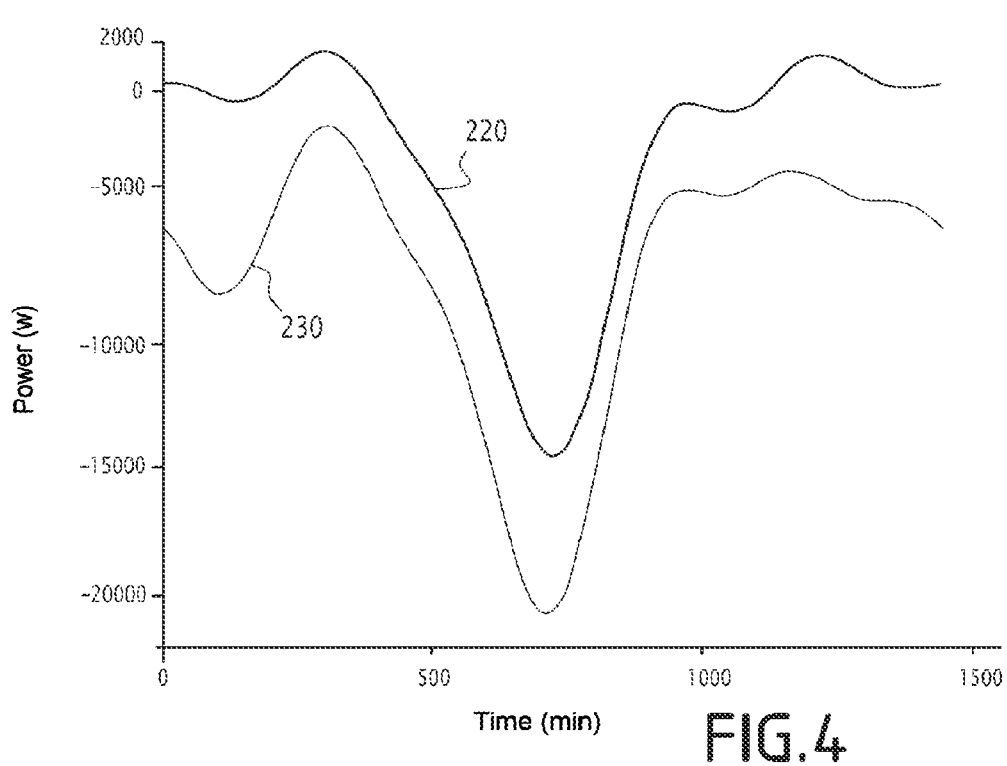
Figure 5:
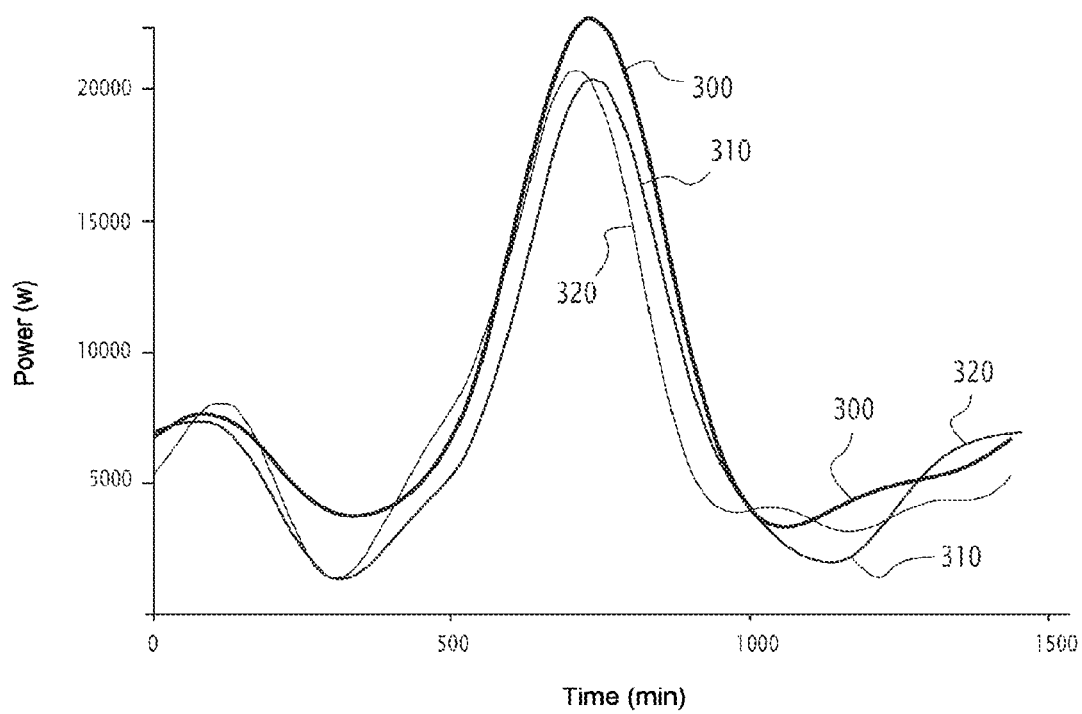

According to another advantageous aspect of the invention, the detection device also comprises an estimation module (30) configured for estimating the peak power of a detected photovoltaic electricity production apparatus from the computed differential profile. These features and advantages of the invention will appear on reading the following description, given solely as a non-restrictive example, with reference to the appended drawings in which:

FIG. 1 is a partial schematic view of an electrical distribution network comprising two electrical installations and a plurality of current sensors, each installation comprising multiple electrical apparatuses and being connected to a distribution node by at least one respective electrical conductor, each sensor being associated with a respective electrical conductor;

FIG. 2 is a flow diagram of a method for detecting at least one photovoltaic electricity production apparatus in the network in FIG. 1, the method comprising a step of acquisition, by a current sensor, of a plurality of active power profiles of a corresponding installation, each active power profile comprising a plurality of active power measurements each associated with a respective time instant of a time range;

FIG. 3 is an example of two differential profiles computed according to the method in FIG. 2, each differential profile being computed from a pair of active power profiles and comprising a plurality of values, each value of the differential profile being equal to the difference between two respective measurements;

FIG. 4 is an example of two differential profiles computed according to the method in FIG. 2 from two pairs of active power profiles whereof the frequential components have been filtered by a low-pass filter; and FIG. 5 is an example of three differential profiles selected from among a plurality of differential profiles computed according to the method in FIG. 2, the absolute value of each differential profile selected being the maximum for a time instant between two predefined time instants.

In the remainder of the description, the expression 'substantially equal' defines a relationship of equality to within plus or minus 10%.

In the remainder of the description, pair of elements means a set of two elements.

In FIG. 1, a low-voltage (LV) electricity distribution network 2 is partially and schematically represented. The low-voltage network 2 comprises a medium voltage/low voltage (MV/LV) transformer station 4, and a plurality of electrical installations 6. Each electrical installation 6 is connected to the transformer station 4 by at least one electrical conductor 8.

The MV/LV transformer station 4 comprises a MV/LV transformer 10, connected to a distribution switchboard 12 via a node 14. The MV/LV transformer station 4 further comprises at least one current sensor 16, and a detection device 18. In FIG. 1, the MV/LV transformer station 4 comprises six current sensors 16, each being associated with a respective phase conductor.

As an optional addition, the MV/LV transformer station 4 comprises an insolation measuring apparatus 17 capable of communicating to the detection device 18 a value of insolation at the MV/LV transformer station 4.

The MV/LV transformer station 4 is supplied by a medium voltage distribution network (not represented) and is capable of supplying electrical installations 6 in low voltage. For example, the medium voltage is between 1 kV and 50 kV, and the low voltage is between 50 V and 1 kV.

Each electrical installation 6 comprises at least one electrical apparatus 20. The electrical apparatus 20 is, for example, an electricity consumer apparatus, or an electricity producer apparatus, such as a photovoltaic electricity production apparatus.

The electrical installation 6 is, for example, overall an electricity consumer. As a variant, the electrical installation 6 produces more electricity than it consumes, i.e. overall it is electricity-producing.

In FIG. 1, two electrical installations 6 and 6 have been represented. Each of the two electrical installations 6 comprises five electrical apparatuses 20.

Each electrical conductor 8 is capable of carrying a low-voltage electrical current from the MV/LV transformer station 4 to the corresponding installation 6.

The distribution switchboard 12 receives a low-voltage current from the MV/LV transformer 10, via the node 14. The distribution switchboard 12 receives one end of each electrical conductor 8. The electrical conductors 8 are grouped together at the distribution switchboard in a number of three-phase outgoing feeders 21. For example, the distribution switchboard 12 supplies between 2 and 10 three-phase outgoing feeders 21. Two three-phase outgoing feeders 21 have been represented in FIG. 1.

Each current sensor 16 is associated with a corresponding conductor 8. The current sensor 16 is configured for measuring at a given time instant a current flowing in the corresponding conductor 8 and communicating the current measurement to the detection device 18.

Preferably, the current sensor 16 is capable of computing the active power flowing in the corresponding conductor 8 from the current measurement, and communicating the active power measurement to the detection device 18. As an optional addition, the current sensor 16 is further capable of computing the reactive power flowing in the corresponding conductor 8 from the current measurement, and communicating the reactive power measurement to the detection device 18.

The current sensor 16 is configured for measuring both a current flowing from the switchboard 12 to the installation 6, and a current flowing from the installation 6 to the switchboard 12. The active power measurement take, for example, positive values when the installation 6 connected to the conductor 8 consumes more electricity than it produces, and negative values when the installation 6 produces more electricity than it consumes.

The current sensor 16 is, for example, a Rogowski coil sensor. The current sensor 16 is, for example, a removable sensor capable of clamping the conductor 8 and being closed by clips.

Preferably, the current sensor 16 is self-powered. For example, the current sensor 16 is powered by energy recovery from the electrical current induced in the current sensor 16 during the passage of current in the conductor 8.

The current sensor 16 is configured for communicating the measured current values or the computed power values to the detection device 18. For example, the current sensor 16 is capable of communicating with the detection device 18 via radio waves. The current sensor 16 uses, for example, a ZigBee communications protocol. As a variant, not represented, the current sensor 16 is capable of communicating with the detection device 18 via wired connection.

The detection device 18 is configured for detecting the presence of at least one photovoltaic electricity production apparatus among the electrical apparatus or apparatuses 20 of the installation 6 considered from the measurements received from the current sensor 16. Preferably, the detection device 18 is configured for detecting the presence of at least one photovoltaic electricity production apparatus among the electrical apparatus or apparatuses 20 of a plurality of installations 6 considered from the measurements received from a plurality of current sensors 16.

The detection device 18 comprises an information processing unit 22A, formed, for example, of a memory 22B and a processor 22C associated with the memory 22B.

The memory 22B is capable of storing a data file containing, for each current sensor 16 associated with a conductor 8, an identifier of the conductor 8 and peak-power information from a corresponding photovoltaic electricity production apparatus.

The memory 22B is also capable of storing a software program 23 for measurement acquisition by each current sensor 16, a differential software program 24 configured for computing the difference between two sets of acquired measurements, a correlation software program 26 configured for computing a coefficient of correlation between the acquired measurements and a reference profile, and a software program 28 for detecting the presence of a photovoltaic electricity production apparatus among the electrical apparatus or apparatuses 20 of the installation considered.

As an optional addition, the memory 22B is also capable of storing a software program 30 for estimating the peak power of a detected photovoltaic electricity production apparatus.

The processor 22C is capable of executing each of the acquisition 23, differential 24, correlation 26, detection 28 and estimation 30 software programs. The acquisition 23, differential 24, correlation 26, detection 28 and estimation 30 software programs form, when they are executed by the processor 22C, respectively a measurement acquisition module, a differential module configured for computing the difference between two sets of acquired measurements, a correlation module configured for computing a coefficient of correlation between the acquired measurements and a reference profile, a module for detecting the presence of a photovoltaic electricity production apparatus, and a module for estimating the peak power of a detected photovoltaic electricity production apparatus.

As a variant, the acquisition module 23, the differential module 24, the correlation module 26, the detection module 28, and the estimation module 30 are implemented in the form of programmable logic components, or even in the form of dedicated integrated circuits.

In FIG. 1, the detection device 18 is integrated in the MV/LV transformer station 4, and is supplied with current from node 14. As a variant not represented, the detection device 18 is located in a dedicated installation, remote from the transformer station 4.

Each three-phase outgoing feeder 21 comprises four conductors 8 corresponding respectively to a first phase, a second phase, a third phase and to the neutral voltage.

The acquisition module 23 is capable of receiving, from each current sensor 16, a plurality of active power profiles of a corresponding installation, each active power profile comprising a plurality of active power measurements each associated with a respective time instant of a time range.

As a variant, the acquisition module 23 is configured for acquiring, from each current sensor 16, a plurality of current measurements each associated with a respective time instant of a time range, then for computing a corresponding active power profile from a known voltage value. As a variant, the acquisition module 23 is capable of receiving a voltage measurement, then computing the corresponding active power profile from the voltage measurement received.

Each active power profile comprises a plurality of frequential components.

As an optional addition, the acquisition module 23 is further configured for receiving, from each current sensor 16, a plurality of reactive power profiles of a corresponding installation, each reactive power profile comprising a plurality of reactive power measurements each associated with a respective time instant of a time range. For example, the acquisition module 23 is capable of computing the reactive energy consumed by the installation considered during the corresponding time range. Preferably, each reactive power measurement is performed at the same time as an active power measurement of a corresponding active power profile, and the acquisition module 23 is capable of computing the energy consumed by the installation considered during the time range of a corresponding active power profile.

As an optional addition, the acquisition module 23 is configured for receiving from the insolation measuring apparatus 17 a value of insolation at the MV/LV transformer station 4 during a time range. As a variant, as an optional addition, the acquisition module 23 is configured for receiving from a remote electronic installation (e.g. via the Internet) an estimate of the average insolation at the MV/LV transformer station 4 during a time range.

Preferably, each time range corresponds to a respective day of measurement. Preferably, all the time ranges have substantially the same duration. For example, each time range lasts 24 hours, and each time range corresponds to one respective day. Preferably, each time range comprises a daytime period and a night-time period.

Preferably, the measurements are performed each day at the same time instants. For example, the measurements are performed every 1 to 10 minutes. Preferably, the measurement days are consecutive, in order to limit the influence of seasonal variation in the climate and the length of day. For example, the acquisition module 23 is configured for receiving from the current sensor 16 a predefined number of active power profiles each corresponding to one consecutive day, corresponding to a predefined observation period. The observation period is, for example, a period of two weeks.

As an optional addition, the acquisition module 23 comprises a filter (not represented) capable of filtering the frequential components of each power profile received. Preferably, the filter is a low-pass filter having a cutoff frequency substantially equal to $3.10^{-4}$ Hz. In other words, only the frequential components having a frequency of less than $3.10^{-4}$ Hz are retained after filtering.

Preferably, the acquisition module 23 comprises a memory, not represented, for storing a plurality of acquired power profiles.

The acquisition module 23 is further capable of transmitting each acquired power profile to the differential module 24.

The differential module 24 is configured for receiving a plurality of active power profiles from the acquisition module 23 and computing a differential profile for at least one pair of active power profiles. Each differential profile comprises a plurality of values, each value of the differential profile being equal to the difference between two respective measurements of the active power profiles of said pair. Preferably, the respective time ranges of the active power profiles of each pair have substantially equal durations.

For example, the differential module 24 is configured for computing a differential profile for each of the pairs of active power profiles. In other words, the differential module is configured for computing a differential profile corresponding to the association of each of the acquired active power profiles with each of the other active power profiles. Preferably, the differential module 24 is configured for selecting one or more differential profiles from among the computed differential profiles.

For example, the differential module 24 is configured for selecting only the differential profiles whereof the maximum absolute value is greater than half the maximum of the set of absolute values of the computed differential profiles.

As a variant, the differential module 24 is configured for selecting only the differential profiles whereof the maximum value of the absolute value corresponds to a time instant between two predefined time instants. For example, for differential profiles computed from a pair of active power profiles measured in summer, only the differential profiles whereof the absolute value is maximum between 1 pm and 3 pm are selected.

As an optional addition, the differential module 24 is configured for selecting a pair of active power profiles from among the plurality of active power profiles, and for computing a differential profile from the selected pair of active power profiles. Preferably, the differential module 24 is configured for selecting a plurality of pairs of active power profiles and computing a corresponding differential profile for each pair.

Preferably, the differential module 24 is configured for selecting a pair of active power profiles for which the electrical energy consumption for the installation considered is substantially equal, from one profile of the pair to the other profile, during the measurement time range of each of the two profiles of said pair. For example, the differential module 24 is configured for selecting only the pairs for which the total consumption of reactive energy corresponding to one of the profiles of the pair is substantially equal to the total consumption of reactive energy corresponding to the other profile of the pair. As a variant or as an addition, the differential module 24 is configured for selecting only the pairs for which the total consumption of active energy during the night-time period corresponding to one of the profiles of the pair is substantially equal to the total consumption of active energy during the night-time period corresponding to the other profile of the pair.

As a variant or as an addition, the differential module 24 is configured for selecting a pair of active power profiles for which the photovoltaic electricity production is different. For example, the differential module 24 is configured for selecting only the pairs for which the acquired insolation value differs from one profile to the other.

The differential module 24 is appropriate for transmitting the computed differential profile or profiles to the correlation module 26.

The correlation module 26 is configured for computing a coefficient of correlation between the differential profile or profiles received and a reference profile corresponding to a photovoltaic electricity production. The coefficient of correlation is, for example, obtained by a fit using the method of least squares.

Preferably, the correlation module 26 is configured, in case of a plurality of differential profiles computed by the differential module 24, for computing an average differential profile equal to an average of the differential profiles received, and for computing a coefficient of correlation between the computed average differential profile and a reference profile corresponding to a photovoltaic electricity production. The average is, for example, an arithmetic average. As a variant, the average is a geometric average.

The correlation module 26 is appropriate for transmitting the computed coefficient of correlation to the detection module 28.

The detection module 28 is configured for detecting a photovoltaic electricity production apparatus among the electrical apparatus or apparatuses of the installation 6 considered from the coefficient of correlation computed by the correlation module 26. For example, the detection module 28 is configured for comparing the coefficient of correlation with a predefined value, and for detecting the presence of a photovoltaic electricity production apparatus in the installation 6 considered when the coefficient of correlation is greater than the predefined value.

As an optional addition, the estimation module 30 is configured for estimating the peak power of each photovoltaic electricity production apparatus detected. For example, the estimation module 30 is capable of receiving the parameters of the fit performed, from the correlation module 26. Preferably, the estimation module 30 is configured for computing the peak power of the detected photovoltaic production apparatus having the production profile corresponding to the fit parameters.

The operation of the detection device 18 will now be described with the aid of FIG. 2 representing a flow diagram of the detection method according to the invention.

In an initial step 100, the acquisition module 23 receives during a predefined time period, e.g. fourteen consecutive days, an active power profile from a current sensor 16, which it stores in memory. Each active power profile comprises a plurality of active power measurements each associated with a respective time instant of a respective time range. Two consecutive time instants are, for example, separated by one minute. Each time range lasts for 24 hours, from midnight to midnight, and comprises one daytime period and at least one night-time period. For each time range of an active power profile there is a corresponding reactive power profile.

When the active power profiles and the reactive power profiles have been acquired for the predefined time period, the acquisition module 23 transmits the active power profiles and the reactive power profiles to the differential module 24.

As an optional addition, the acquisition module 23 filters out the highest frequential components of each of the acquired active power profiles. In particular, the acquisition module 23 removes components whereof the frequency is higher than $3.10^{-4}$ Hz.

FIG. 3 presents two differential profiles 200, 210 computed from two unfiltered pairs of profiles. FIG. 4 presents two differential profiles 220, 230 computed from two filtered pairs of profiles.

The differential module 24 then selects, at step 110, one or more pairs of active power profiles from among all the active power profiles received.

Only the pair or pairs for which the total consumption of reactive energy corresponding to one of the profiles of the pair is substantially equal to the total consumption of reactive energy corresponding to the other profile of the pair are selected.

As a variant or as an addition, only the pair or pairs for which the total consumption of active energy during the night-time period corresponding to one of the profiles of the pair is substantially equal to the total consumption of active energy during the night-time period corresponding to the other profile of the pair are selected.

As a variant or as an addition, the pairs of active power profiles for which the acquired insolation value is substantially equal from one profile to the other are not selected. In other words, only the pairs of power profiles corresponding to a different insolation are selected.

As a variant or as an addition, if one of the two active power profiles has been acquired during a working day whereas the other profile has been acquired during a non-working day, then the pair of profiles is not selected. In other words, only the pairs whereof both profiles correspond to the same type of day from among working days and non-working days are selected.

The differential module 24 then computes for each pair of selected profiles a corresponding differential profile. From among these computed differential profiles, the differential module 24 then selects, as an optional addition, a plurality of differential profiles.

Only the differential profiles whereof the maximum absolute value is greater than half the maximum of the set of absolute values of the computed differential profiles are selected.

As a variant or as an addition, only the differential profiles whereof the maximum value corresponds to a time instant between 12 pm and 2 pm in winter, or between 1 pm and 3 pm in summer, are retained. Three differential profiles satisfying this criterion are, for example, represented in FIG. 5, with the curves 300, 310, 320.

During step 120, the correlation module 26 computes a coefficient of correlation between the computed differential profile or profiles and a reference profile corresponding to a photovoltaic electricity production. For example, the correlation module 26 performs a fit between the computed differential profile or profiles and said reference profile using a method of least squares. The correlation module 26 then determines a set of parameters of the reference profile for the best fit with the average differential profile.

As a variant or as an addition, in case of a plurality of differential profiles computed by the differential module 24, the correlation module 26 computes an average differential profile equal to the arithmetic average of the computed differential profiles, and then computes a coefficient of correlation between the computed average differential profile and a reference profile corresponding to a photovoltaic electricity production.

The detection module 28 then detects in step 130 the presence of at least one photovoltaic electricity production apparatus in the installation 6 connected to the cable 8 corresponding to the current sensor 16 when the coefficient of correlation computed in step 120 is greater than a predefined value.

Following the detection step 130, the estimation module 30 estimates during step 140 the peak power of the photovoltaic electricity production apparatus 20 detected, if there is one. For example, the estimation module receives the parameters determined during step 120, and computes from these parameters the peak power of a photovoltaic production apparatus allowing the best fit with the average differential profile.

Finally, the data file stored in the memory 22B is updated during a step 150, for matching the peak power estimated in step 140 to the identifier of the current sensor considered during steps 100 to 140. If step 130 has not enabled a photovoltaic electricity production apparatus to be detected, the corresponding peak power is then set equal to 0.

Another optional current sensor is selected in the next step 160, and steps 100 to 150 are then repeated. Steps 100 to 150 are thus repeated in this order for each of the other current sensors 16 of the network 2.

Thus, the method can be used, for each of the electrical installations 6 of the network 2, to detect whether the installation comprises at least one photovoltaic electricity production apparatus. It can also be used to estimate the peak power of each of the photovoltaic electricity production apparatuses detected. This method can therefore be used to better dimension the network 2 through an accurate assessment of the expected variations in photovoltaic electricity production. It can also be used to adjust the structure of the network, for example, to best distribute the photovoltaic electricity production apparatuses over the various phases of the same outgoing feeder 21. It is not necessary to provide each conductor 8 with a current sensor 16, the current sensor 16 being movable from one conductor 8 onto another conductor 8 before repeating steps 100 to 150.

As a variant, step 100 is performed simultaneously for all the current sensors 16 of the network 2. The acquisition module 23 then receives an active power profile from each of the sensors 16 each day. When each sensor 16 has supplied the set of active power profiles for the predefined time period to the acquisition module 23, steps 110 to 130 are then performed for each set of active power profiles associated with each sensor.

The method can then be used to minimize the time needed for acquiring measurements.

As a variant, 60 active power profiles corresponding to two months of measurement are acquired in step 100. In this case, all the pairs whereof the two profiles have been acquired with a difference of more than 14 days are rejected during step 110.

The process then provides greater accuracy of detection thanks to the larger sample used, while limiting the influence of the seasonal variation of insolation.

As a further variant, the method is repeated each day on all the current sensors 16 of the network 2. In this case, all the active power profiles that have been acquired more than 14 days previously are rejected during step 110.

This method can therefore be used to continuously monitor changes in the network 2, and to automatically detect the addition of a new photovoltaic production apparatus in an electrical installation 6 corresponding to the network 2.

The invention claimed is:

1. A method for detecting at least one photovoltaic electricity production apparatus in an electrical distribution network comprising at least one electrical installation and at least one current sensor, each installation comprising at least one electrical apparatus and being connected to a respective distribution node by at least one respective electrical conductor, each sensor being associated with a respective electrical conductor, the method comprising the following steps:
i/ acquisition, by a current sensor, of a plurality of active power profiles of a corresponding installation, each active power profile comprising a plurality of active power measurements each associated with a respective time instant of a time range;
ii/ computation, for at least one pair of active power profiles, of a differential profile comprising a plurality of values, each value of the differential profile being equal to the difference between two respective measurements of the active power profiles of said pair;
iii/ computation of a coefficient of correlation between the differential profile or profiles computed and a reference profile corresponding to a photovoltaic electricity production;
iv/ detection of the presence of a photovoltaic electricity production apparatus among the electrical apparatus or apparatuses of the installation considered when the coefficient of correlation is greater than a predefined value.

2. The method according to claim 1, in which the respective time ranges of the active power profiles of each pair have substantially equal durations.

3. The method according to claim 1, in which step ii/ comprises selection, from among the plurality of acquired profiles, of a pair of profiles for which the consumption of electrical energy by the installation considered is substantially equal, from one profile of the pair to the other, during the measurement time range of each of the two profiles of said pair, and the computation of the differential profile is performed from the selected pair of profiles.

4. The method according to claim 3, in which step i/ further comprises acquisition of a plurality of reactive power profiles, each reactive power profile comprising a plurality of reactive power measurements each associated with a respective time instant of the time range of a corresponding active power profile, and computation from each reactive power profile of the reactive energy consumed during the corresponding time range, and in which the selection of the pair of profiles performed during step ii/comprises the selection of a pair of profiles for which the total consumption of reactive energy corresponding to one of the profiles of the pair is equal, within 10%, to the total consumption of reactive energy corresponding to the other profile of the pair.

5. The method according to claim 3, in which the time range corresponding to each active power profile comprises a daytime period and a night-time period, and in which the selection of the pair of profiles performed during step ii/comprises the selection of a pair of profiles for which the total consumption of active energy during the night-time period corresponding to one of the profiles of the pair is equal, within 10%, to the total consumption of active energy during the night-time period corresponding to the other one of the profiles of the pair.

6. The method according to claim 1, in which step i/ further comprises the acquisition of an insolation value during the measurement of each active power profile, and step ii/ comprises selection, from among the plurality of acquired active power profiles, of at least one pair of profiles for which the acquired insolation value differs from one profile to the other, and the computation of the differential profile is performed from the selected pair of profiles.

7. The method according to claim 1, in which step ii/ comprises the computation of a differential profile for each pair of active power profiles, and selection of at least one differential profile whereof the maximum absolute value is greater than half the maximum of the set of absolute values of the computed differential profiles, and during step iii/, the computation of the coefficient of correlation is performed according to the differential profile or profiles selected.

8. The method according to claim 1, in which step ii/ comprises the computation of at least one differential profile for each pair of active power profiles, and selection of a differential profile whereof the absolute value has a maximum value for a time instant between two predefined time instants, and during step iii/, the computation of the coefficient of correlation is performed according to the differential profile or profiles selected.

9. The method according to claim 1, in which, when multiple differential profiles are computed during step ii/, step iii/ further comprises the computation of an average differential profile equal to an average of the computed differential profiles, and the coefficient of correlation is computed between the average differential profile and the reference profile corresponding to the photovoltaic electricity production.

10. The method according to claim 1, in which during step i/, each active power profile comprises frequential components, and the frequential components of each active power profile of at least one pair are filtered by a low-pass filter having a cutoff frequency substantially equal to $3.10^{-4}$ Hz, and the computation of the differential profile is performed from the filtered pair of profiles.

11. The method according to claim 1, further comprising a step of estimating the peak power of a photovoltaic electricity production apparatus detected from the computed differential profile.

12. The method according to claim 1, in which steps i/ to iv/ are repeated from active power profiles acquired by another current sensor.

13. A computer program product comprising a non-transitory, computer-readable medium storing software instructions that, when they are executed by a computer, implement a method according to claim 1.

14. A device for detecting at least one photovoltaic electricity production apparatus in an electrical distribution network comprising at least one electrical installation and at least one current sensor, each installation comprising at least one electrical apparatus and being connected to a respective distribution node by at least one respective electrical conductor, each sensor being associated with a respective electrical conductor, the detection device comprising:
- an acquisition module configured for acquiring, by a current sensor, a plurality of active power profiles of a corresponding installation, each active power profile comprising a plurality of active power measurements each associated with a respective time instant of a time range;
- a differential module configured for computing, for at least one pair of active power profiles, a differential profile comprising a plurality of values, each value of the differential profile being equal to the difference between two respective measurements of the active power profiles of said pair;
- a correlation module configured for computing a coefficient of correlation between the differential profile or profiles computed and a reference profile corresponding to a photovoltaic electricity production; and
- a detection module configured for detecting the presence of a photovoltaic electricity production apparatus among the electrical apparatus or apparatuses of the installation considered when the coefficient of correlation is greater than a predefined value.

15. The detection device according to claim 14, further comprising an estimation module configured for estimating the peak power of a detected photovoltaic electricity production apparatus from the computed differential profile.

* * * * *